United States Patent
Jeon et al.

(10) Patent No.: US 9,543,907 B2
(45) Date of Patent: Jan. 10, 2017

(54) CURRENT-VOLTAGE CONVERSION AMPLIFIER CIRCUIT INCLUDING MULTIPLIER WITH A CURRENT OFFSET REMOVAL UNIT AND MULTI INPUT AMPLIFIER

(71) Applicant: Electronics and Telecommunications Research Institute, Daejeon (KR)

(72) Inventors: Young-deuk Jeon, Daejeon (KR); Jung Hee Suk, Daejeon (KR); Chun-Gi Lyuh, Daejeon (KR); Yi-Gyeong Kim, Daejeon (KR); Jong Pil Im, Suwon (KR); Min-Hyung Cho, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 107 days.

(21) Appl. No.: 14/605,877

(22) Filed: Jan. 26, 2015

(65) Prior Publication Data
US 2015/0349728 A1 Dec. 3, 2015

(30) Foreign Application Priority Data
Jun. 2, 2014 (KR) ........................ 10-2014-0066879

(51) Int. Cl.
*H03F 3/08* (2006.01)
*H03G 3/00* (2006.01)
(Continued)

(52) U.S. Cl.
CPC .............. *H03F 3/082* (2013.01); *H03F 3/087* (2013.01); *H03F 3/45475* (2013.01);
(Continued)

(58) Field of Classification Search
CPC ...... H03F 3/082; H03F 3/087; H03F 3/45968; H03F 3/72; H03F 1/0238; H03F 3/605
(Continued)

(56) References Cited

U.S. PATENT DOCUMENTS

| 6,353,367 B1* | 3/2002 | Chiu .......................... H03F 1/14 330/100 |
| 7,539,424 B2 | 5/2009 | Kang et al. |
| 2012/0315052 A1 | 12/2012 | Liu et al. |

OTHER PUBLICATIONS

Paul Wright et al., "Design of High-Performance Photodiode Receivers for Optical Tomography", IEEE Sensors Journal, Apr. 2005, pp. 281-288, vol. 5, No. 2, IEEE.

* cited by examiner

Primary Examiner — Que T Le

(57) ABSTRACT

Provided is a current-voltage conversion amplifier circuit including: a plurality of light receiving devices generating a current signal proportional to an amount of light by receiving the light; multipliers amplifying the current signal, converting the amplified current signal into a first voltage signal, outputting the amplified current signal, or outputting the converted first voltage signal; multi input amplifiers outputting first and second output voltage pairs through a process for receiving output values of multipliers and an offset voltage and amplifying the received output values and offset voltage; a multiplexing unit selecting and outputting one first and second output voltage pair among the first and second output voltage pairs outputted from multi input amplifiers; and a signal conversion unit converting a difference value between first and second output voltages outputted from the multiplexing unit and outputting the converted digital signal.

10 Claims, 4 Drawing Sheets

(51) Int. Cl.
 *H03F 3/45* (2006.01)
 *H03M 1/12* (2006.01)
(52) U.S. Cl.
 CPC ... *H03G 3/008* (2013.01); *H03F 2203/45088* (2013.01); *H03F 2203/45514* (2013.01); *H03F 2203/45551* (2013.01); *H03F 2203/45614* (2013.01); *H03M 1/121* (2013.01)
(58) Field of Classification Search
 USPC ...... 250/214 R, 214 A, 214.1, 207; 327/514, 327/515; 330/59, 130, 134–136, 96
 See application file for complete search history.

CURRENT-VOLTAGE CONVERSION AMPLIFIER CIRCUIT INCLUDING MULTIPLIER WITH A CURRENT OFFSET REMOVAL UNIT AND MULTI INPUT AMPLIFIER

CROSS-REFERENCE TO RELATED APPLICATIONS

This U.S. non-provisional patent application claims priority under 35 U.S.C. §119 of Korean Patent Application No. 10-2014-0066879, filed on Jun. 2, 2014, the entire contents of which are hereby incorporated by reference.

BACKGROUND OF THE INVENTION

The present invention disclosed herein relates to an amplifier circuit, and more particularly, to a current-voltage conversion amplifier circuit.

An amplifier circuit means an electronic circuit amplifying the voltage, current, and power of an input signal to generate an output signal. The amplifier circuit includes a voltage amplifier circuit, a current amplifier circuit, a power amplifier circuit, and a current-voltage amplifier circuit converting current signal into voltage signal and amplifying it.

A high-impedance preamplifier and a transimpedance amplifier are mainly used as the current-voltage conversion amplifier circuit. The high-impedance preamplifier improves the reception sensitivity by increasing a load resistance to increase an input voltage. The transimpedance amplifier uses a resistance in a feedback loop. The thermal noise of the transimpedance amplifier is reduced by the resistance. Additionally, the transimpedance amplifier has a more improved dynamic range compared to the high-impedance preamplifier.

However, the transimpedance amplifier requires a resistance of hundreds of ohms to process a small current signal. Therefore, when the transimpedance amplifier is used in the current-voltage conversion amplifier circuit, its power consumption is high and its circuit area is increased.

SUMMARY OF THE INVENTION

The present invention provides a current-voltage conversion amplifier circuit reducing power consumption and circuit area.

Embodiments of the present invention provide current-voltage conversion amplifier circuits including: a plurality of light receiving devices generating a current signal proportional to an amount of light by receiving the light; a plurality of multipliers amplifying the current signal, converting the amplified current signal into a first voltage signal, outputting the amplified current signal, or outputting the converted first voltage signal; a plurality of multi input amplifiers outputting first and second output voltage pairs through a process for receiving output values of the plurality of multipliers and an offset voltage and amplifying the received output values and offset voltage; a multiplexing unit selecting and outputting one first and second output voltage pair among the first and second output voltage pairs outputted from the plurality of multi input amplifiers; and a signal conversion unit converting a difference value between first and second output voltages outputted from the multiplexing unit and outputting the converted digital signal.

In some embodiments, the signal conversion unit may change an output range of the digital signal outputted from the signal conversion unit according to a magnitude of the offset voltage.

In other embodiments of the present invention, multipliers include: a bias terminal applying a bias current to a first node; a start-up unit connected between the first node and a power terminal and applying an additional current to the first node; a reference voltage generation unit connected between a second node and a ground terminal and maintaining a voltage constantly between the second node and the ground terminal; a discharging unit connected between a third node and the ground terminal and discharging a voltage of the third node; a current offset removal unit connected between the power terminal and the second node and removing a dark current outputted even when light is not incident to a light receiving device; a current signal amplifier unit connected between the power terminal and an output terminal and amplifying a current signal outputted from the light receiving device and outputting the amplified current signal; and a current-voltage selection unit connected to a fourth node and converting the amplified current signal into a first voltage signal according to a conversion signal, wherein the light receiving device is connected to the third node.

In some embodiments, the start-up unit may include a first switch connected to the first node and a first start-up transistor diode-connected between the first switch and the power terminal, wherein the first switch may apply the additional current applied through the first start-up transistor to the first node according to a first switching signal applied to a gate terminal.

In other embodiments, the reference voltage generation unit may include a first reference voltage generation transistor connected between the second and third nodes and a second reference voltage generation transistor connected between the first node and the ground terminal, wherein the first reference voltage transistor may be turned-on by the first node voltage applied to the gate terminal and may apply to the third node a current signal having the same magnitude as the current signal outputted from the light receiving device.

In still other embodiments, the second reference voltage generation transistor may be turned-on by the third node voltage applied to a gate terminal and may maintain voltages of the first and third nodes constantly by discharging a voltage of the first node.

In even other embodiments, the discharging unit may include a discharge transistor diode-connected to the third node and a discharging switch connected between the discharging transistor and the ground terminal, wherein the discharging switch may apply a third node voltage applied to the discharging transistor to the ground terminal according to a discharging signal applied to a gate terminal.

In yet other embodiments, the current offset removal unit may include a plurality of dark current removal switches connected to the first node and a plurality of current sources connected between the plurality of dark current removal switches and the power terminal, wherein at least one dark current removal switch connected to at least one current source activated proportional to a magnitude of the dark current outputted from the light receiving device may be turned-on.

In further embodiments, a current having a magnitude identical or similar to that of the dark current may flow in the at least one activated current source.

In still further embodiments, the current signal amplifier unit may include: a first current mirror transistor connected between the power terminal and the second node; a second current mirror transistor having a gate terminal connected to a drain terminal of the first current mirror transistor; a plurality of amplification switches connected between the fourth node and the output terminal; and a plurality of current signal amplification transistors connected between the plurality of amplification switches and the power terminal and having gate terminals connected to a gate terminal of the first current mirror transistor.

In even further embodiments, a gate voltage having the same magnitude as the first current mirror transistor may be applied to each of the second current mirror transistor and the plurality of current signal amplification transistors; a magnitude of the current signal amplified may be determined by a ratio of a size with respect to the first current mirror transistor; and at least one amplification switch connected at least one activated current signal amplification transistor may be turned-on.

In yet further embodiments, the signal conversion unit may include a conversion switch connected to the fourth node and a resistor connected between the conversion switch and the ground terminal; when turned-off by the conversion signal applied to a gate terminal, the conversion switch may output the amplified current signal an output terminal; and when turned-on by the conversion signal, the conversion switch may convert the amplified current signal into the first voltage signal by the resistor and may output the converted first voltage signal.

In still other embodiments of the present invention, multi input amplifiers include: an input terminal receiving a current signal or a first voltage signal; a first amplifier unit converting signals applied from the input terminal and the offset terminal into first and second sampling voltages and outputting the converted first and second sampling voltages; a second amplifier unit converting signals inputted from the input terminal and a common terminal into third and fourth sampling voltages and outputting the converted third and fourth sampling voltages; a differential amplifier receiving the first and second sampling voltages and converting the received first and second sampling voltages into a first output voltage to output the converted first output voltage, and receiving the third and fourth sampling voltages and converting the received third and fourth sampling voltages into a second output voltage to output the converted second output voltage; a first output unit connected between the differential amplifier and a first output terminal and amplifying the first output voltage by a predetermined gain to output the amplified first output voltage to the first output terminal; and a second output unit connected between the differential amplifier and a second output terminal and amplifying the second output voltage by the predetermined gain to output the amplified second output voltage to the second output terminal.

In some embodiments, the first amplifier unit may include: a first reset switch connected to a first node and applying a common mode voltage to the first node according to a first and second reset signal applied to a gate terminal; a first switch connected between the first node and a second node and applying the amplified current signal and the first voltage signal applied from the input terminal to the second node according to a first initial value sampling signal applied to the gate terminal; a first capacitor connected to the second node and charged by the amplified current signal and the first voltage signal; a second switch connected to a third node and applying an offset voltage applied from the offset terminal to the third node according to a first data sampling signal applied to the gate terminal; a second capacitor connected to the third node and charged by the offset voltage; a third switch connected between the second node and the third node and turned-on or turned-off according to an amplification mode signal applied to the gate terminal; a fourth switch connected to a fourth node and applying the common mode voltage to the fourth node according to a second initial value sampling signal applied to the gate terminal; a fifth switch connected to a fifth node and applying the common mode voltage to the fifth node according to a second data sampling signal applied to the gate terminal; a sixth switch connected to the fourth node and applying the sampling voltage outputted from the first capacitor to the first differential amplifier and the first amplifier unit according to the amplification mode signal applied to the gate terminal; and a seventh switch connected to the fifth node and applying the second sampling voltage outputted from the second capacitor to the differential amplifier according to the amplification mode signal applied to the gate terminal.

In other embodiments, the first output unit may include: a third capacitor connected to a sixth node and determining a gain of a first output voltage according to a ratio of the sum of capacities of the first and second capacitors; an eighth switch connected to the six node and applying the common mode voltage to the third capacitor according to a first sampling mode signal applied to the gate terminal; and a ninth switch connected to the third capacitor and applying the common mode voltage to the third capacitor according to a second sampling mode signal applied to the gate terminal.

In still other embodiments, a first output terminal may be connected to the sixth node; the first output voltage may be outputted through the first output terminal; and a gain of the first output voltage may be changed in proportion to a ratio of the sum of capacities of the first and second capacitors and a capacity of a third capacitor.

In even other embodiments, the second amplifier unit may include: a second reset switch applying the common mode voltage to a seventh node according to the first and second reset signal; a tenth switch connected between the seventh node and an eighth node and applying the common mode voltage to the eighth node according to the first initial value sampling signal applied to the gate terminal; a 11th switch connected between the input terminal and a ninth node and applying the amplified current signal or the first voltage signal to the ninth node according to the first data sampling signal applied to the gate terminal; a fourth capacitor connected to the eighth node and charged by the common mode voltage; a fifth capacitor connected to the ninth node and charged by the amplified current signal or the first voltage signal; a 12th switch connected between the eighth node and the ninth node and turned-on or turned-off according to the amplification mode signal applied to the gate terminal; a 13th switch connected to a tenth node and applying the common mode voltage to the tenth node according the second initial value sampling signal applied to the gate terminal; a 14th switch connected between the tenth node and a 11th node and applying the common mode voltage to the 11th node according to the second data sampling signal applied to the gate terminal; a 15th switch connected to the tenth node and applying the fourth sampling voltage outputted from the fourth capacitor to the differential amplifier and the second output unit according to the amplification mode signal applied to the gate terminal; and a 16th switch connected between the 11th node and the differential amplifier and outputting the fifth sampling voltage outputted from the fifth capacitor to the differential amplifier according to the amplification mode signal applied to the gate terminal.

In yet other embodiments, the second output unit may include: a sixth capacitor connected to a 12th node and determining a gain of a second output voltage according to a capacity ratio with respect to the fifth capacitor; a 17th switch connected to the 12th node and applying the common mode voltage to the sixth capacitor according to the first sampling mode signal applied to the gate terminal; and an 18th switch connected to the sixth capacitor and applying the common mode voltage to the sixth capacitor according to the second sampling mode signal.

In further embodiments, a second output terminal may be connected to the 12th node; the second output voltage may be outputted through the second output terminal; and a gain of the second output voltage may be changed proportional to a ratio of the sum of capacities of the fourth and fifth capacitors and a capacity of the sixth capacitor.

In still further embodiments, when the first voltage signal is inputted to the input terminal, the first reset signal may be applied to the gate terminal of the first and second reset switch; when the amplified current signal is inputted to the input terminal, the second reset signal may be applied to the gate terminal of the first and second reset switch; and the amplified current signal may have an initial voltage as the common mode voltage according to the second reset signal.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Various modifications are possible in various embodiments of the present invention and specific embodiments are illustrated in drawings and related detailed descriptions are listed. Accordingly, the present invention is not intended to limit specific embodiments and is understood that it should include all modifications, equivalents, and substitutes within the scope and technical range of the present invention.

Figure 1:
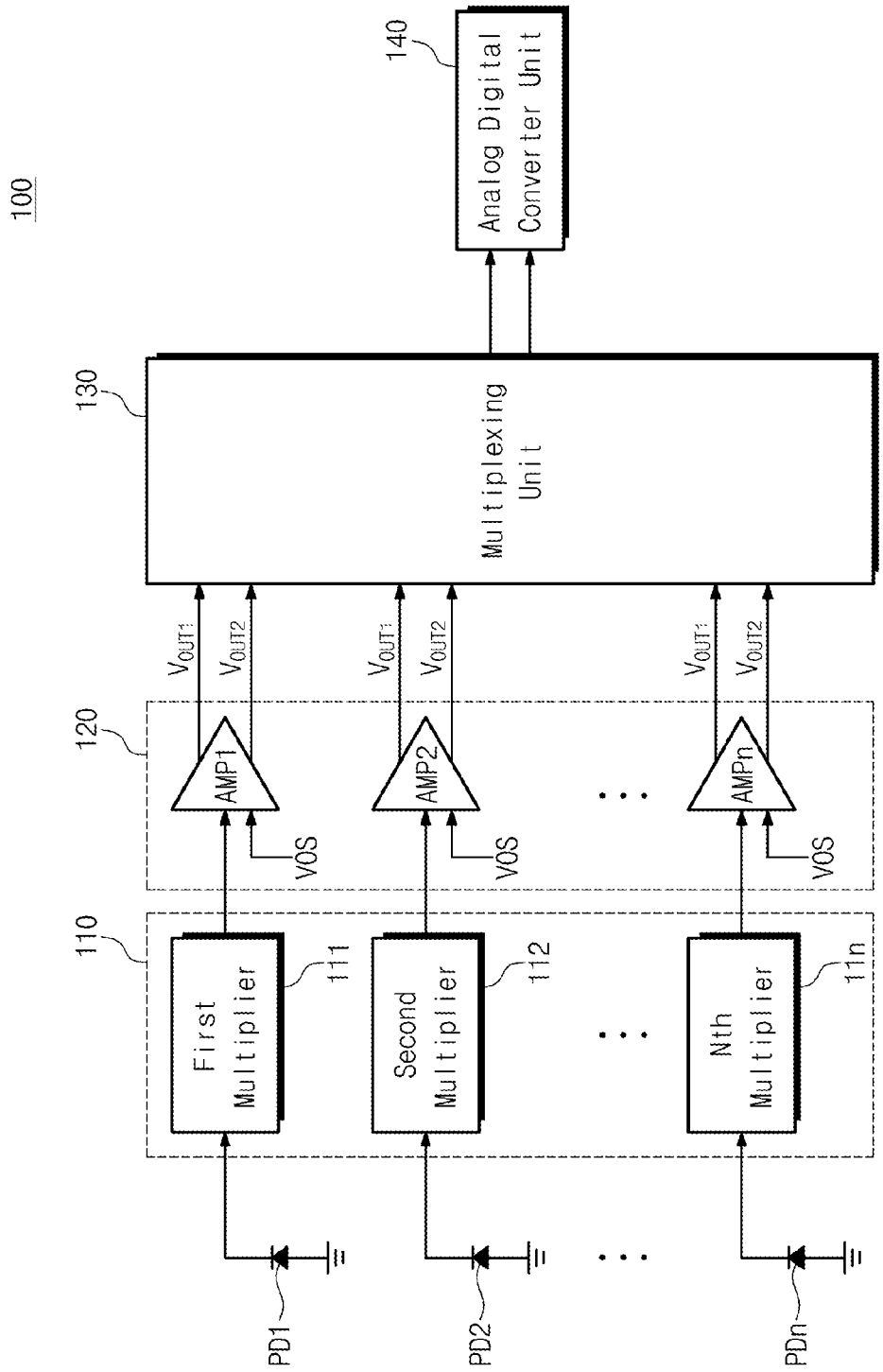
FIG. 1 is a block diagram illustrating a current-voltage conversion amplifier circuit according to an embodiment of the present invention.

FIG. 1 is a block diagram illustrating a current-voltage conversion amplifier circuit according to an embodiment of the present invention. Referring to FIG. 1, a current-voltage conversion amplifier circuit 100 includes first to nth light receiving devices PD1 to PDn, a multiplier unit 110, a multi input amplifier unit 120, a multiplexing unit 130, and an analog digital converter (ADC) unit 140.

The first to nth light receiving devices PD1 to PDn, as a device converting optical signal into current signal, may include photodiodes and photo transistors. As light hits, the first to nth light receiving devices PD1 to PDn generate electrons and positively charged holes and due to this, current signal is generated. The first to nth light receiving devices PD1 to PDn apply the generated current signal to the multiplier unit 110.

The multiplier unit 110 includes first to nth multipliers 111 to 11$n$. The first to nth multipliers 111 to 11$n$ receive current signals from the first to nth light receiving devices PD1 to PDn, respectively. The first to nth multipliers 111 to 11$n$ amplify current signals. The first to nth multipliers 111 to 11$n$ may operate in a current or voltage mode. When operating in a current mode, the first to nth multipliers 111 to 11$n$ amplify current signals and then apply the amplified current signals to the multi input amplifier unit 120. When operating in a voltage mode, the first to nth multipliers 111 to 11$n$ amplify current signals and after converting the amplified current signals into first voltage signals, applies the converted first voltage signals to the multi input amplifier unit 120.

The multi input amplifier unit 120 includes first to nth multi input amplifiers AMP1 to AMPn. An amplified current signal or a first voltage signal and an offset voltage VOS are applied to the first to nth multi input amplifiers AMP1 to AMPn.

When an amplified current signal and an offset voltage VOS are applied, the first to nth multi input amplifiers AMP1 to AMPn convert them into voltage signals by adjusting a sampling time of a current signal. Through the adjustment of a sampling time, the amplification gain of an output voltage signal may vary.

When a first voltage signal and an offset voltage VOS are applied, the first to nth multi input amplifiers AMP1 to AMPn convert the first voltage signal into a second voltage signal. Since the first to nth multi input amplifiers AMP1 to AMPn cannot adjust a sampling time for voltage signal, amplification according to a predetermined gain is possible only.

The first to nth multi input amplifiers AMP1 to AMPn apply first and second output signals VOUT1 and VOUT2 having phases complementary to each other to the multiplexing unit 130. According to the size of an offset voltage VOS, a digital signal output range of the ADC unit 140 is determined.

The multiplexing unit 130 receives a plurality of first and second output signals VOUT1 and VOUT2 from the multi input amplifier unit 120. The multiplexing unit 130 may use an analog multiplexer. The multiplexing unit 130 selects one pair from the plurality of first and second output signals VOUT1 and VOUT2 and then applies it to the ADC unit 140.

The ADC unit 140 may use an analog-to-digital signal converter converting an analog signal into a digital signal. The ADC unit 140 obtains a difference value between first and second output signals VOUT1 and VOUT2 in one pair received from the multiplexing unit 130. The ADC unit 140 converts the difference value into a 10-bit digital signal and outputs it.

The current-voltage conversion amplifier circuit 100 amplifies current signals outputted from the first to nth light receiving devices PD1 to PDn and convert the amplified current signals into voltage signals to output them. When a current signal amplified by the multiplier unit 110 is outputted to the multi input amplifier unit 120, the multi input amplifier unit 120 may adjust an output gain through the sampling time adjustment of a current signal.

Figure 2:
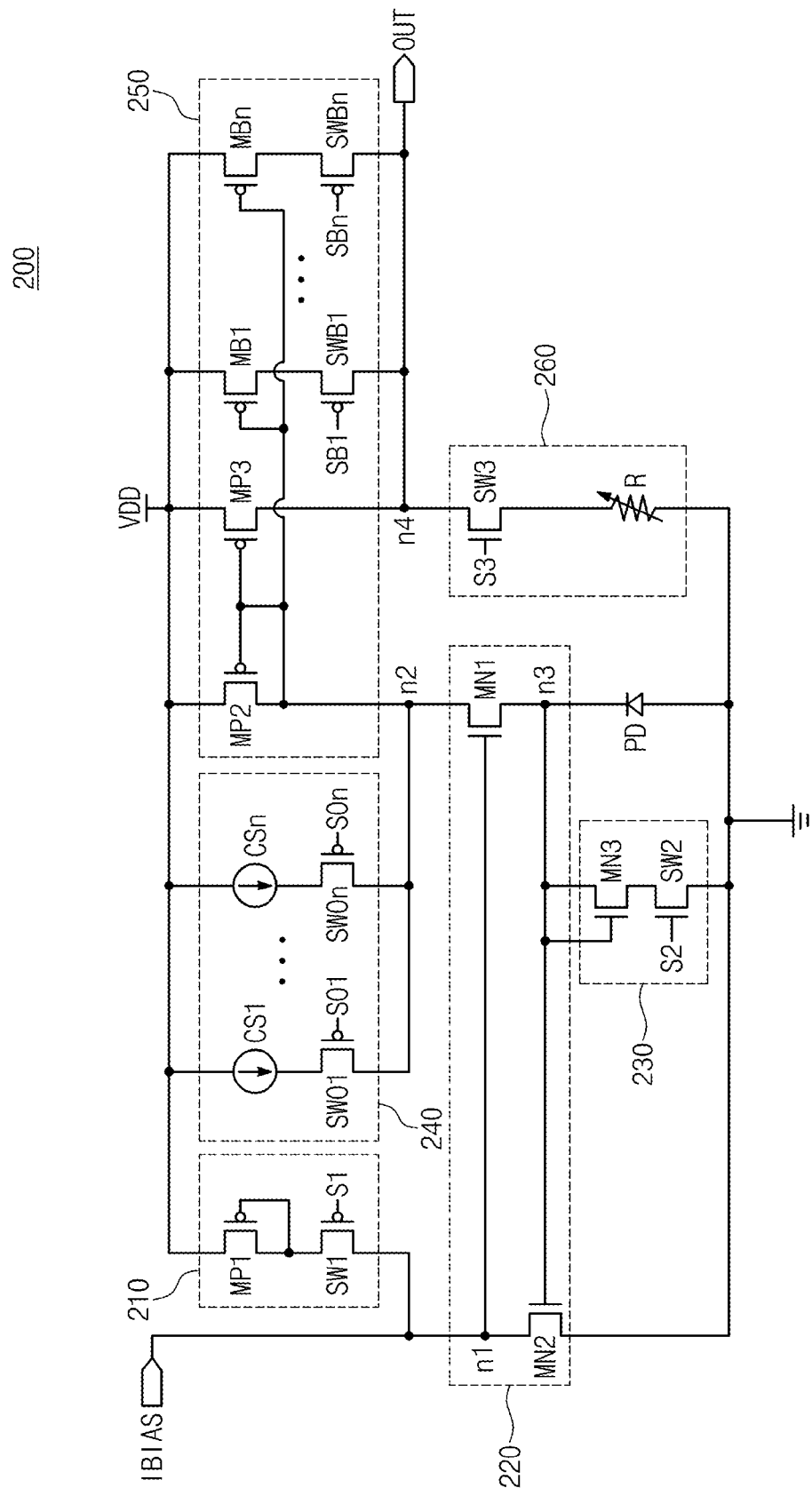
FIG. 2 is a circuit diagram illustrating a multiplier shown in FIG. 1 according to an embodiment of the present invention.

FIG. 2 is a circuit diagram illustrating the multiplier shown in FIG. 1 according to an embodiment of the present invention. The multiplier 200 of FIG. 2 is a circuit diagram illustrating the first to nth multipliers 111 to 11n shown in FIG. 1. The multiplier 200 includes a start-up unit 210, a reference voltage generation unit 220, a discharging unit 230, a current offset removal unit 240, a current signal amplifier unit 250, and a current-voltage selection unit 260.

Through a bias terminal IBIAS, a bias current is applied to a first node n1. The voltage of the first node n1 becomes higher due to the bias current. When the voltage of the first node n1 is increased to a certain degree, the reference voltage generation unit 220 may have a driving capability. In order to drive the reference voltage generation unit 220, a first NMOS transistor MN1 of the reference voltage generation unit 220 needs to be turned-on. However, since the magnitude of a bias current is small, the fast voltage rise of the first node n1 is impossible.

The start-up unit 210 helps the fast drive of the reference voltage generation unit 220. The start-up unit 210 includes a first PMOS transistor MP1 and a first switch SW1. In the first PMOS transistor MP1, a source terminal is connected to a power terminal VDD and a gate terminal and a drain terminal are diode-connected. A source terminal of the first switch SW1 is connected to the drain terminal and the gate terminal of the first PMOS transistor MP1 and a drain terminal of the first switch SW1 is connected to the first node n1.

The start-up unit 210 is driven by a first switching signal S1 applied to the first switch SW1. The first switching signal S1 has a first voltage level L1 according to a high state and a second voltage level L2 according to a low state. When the first NMOS transistor MN1 of the reference voltage generation unit 220 is turned off, the first switching signal S1 of the second voltage level L2 is applied to the first switch SW1. Once the first switch SW1 is turned-on, a current applied through the first PMOS transistor MP1 is applied to the first node n1. Since the voltage of the first node n1 rises faster compared to when a bias current is applied, the fast turn-on of the first NMOS transistor MN1 is possible.

When the first NMOS transistor MN1 of the reference voltage generation unit 220 is turned off, the first switching signal S1 of the second voltage level L1 is applied to the first switch SW1. Once the first switch SW1 is turned off, a current applied to the first node n1 through the first PMOS transistor MP1 may stop. Accordingly, the current consumption of the multiplier 200 may be reduced.

The reference voltage generation unit 220 includes first and second NMOS transistors MN1 and MN2. A gate terminal of the first NMOS transistor MN1 is connected to the first node n1. A drain terminal of the first NMOS transistor MN1 is connected to a second node n2 and its source terminal is connected to a third node n3. A drain terminal of the second NMOS transistor MN2 is connected to the first node n1 and its source terminal is connected to a ground terminal. A gate terminal of the second NMOS transistor MN2 is connected to a third node n3. A light receiving device PD is connected between the third node n3 and the ground terminal.

The first NMOS transistor MN1 is turned-on by the voltage of the first node n1 applied to its gate terminal. Once the first NMOS transistor MN1 is turned-on, the start-up unit 210 stops driving. Once the start-up unit 210 stops driving, only voltage by a bias voltage is applied to the gate terminal of the first NMOS transistor MN1.

When light is incident to the light receiving device PD, the reverse biased light receiving device PD applies a current signal to the ground terminal. No current pass is in the reference voltage generation unit 220. Therefore, a current having the same magnitude as a current signal occurring in the light receiving device PD is applied to the second node n2 through the second PMOS transistor MP2. Since the first NMOS transistor MN1 is in a turned-on state, a current applied through the second PMOS transistor MP2 is applied to the third node n3.

Once the first NMOS transistor MN1 is turned on, the voltage of the third node n3 rises. A voltage is applied to the gate terminal of the second NMOS transistor MN2 through the third node n3 and the second NMOS transistor MN2 is turned-on. The voltage of the first node n1 raised by a bias current is discharged to the ground terminal through the second NMOS transistor MN2. Accordingly, the voltages of the first and third nodes n1 and n3 may be maintained as a reference voltage.

The discharging unit 230 includes a third NMOS transistor MN3 and a second switch SW2. A gate terminal and a drain terminal of the third NMOS transistor MN3 are diode-connected to the third node n3. A source terminal of the third NMOS transistor MN3 is connected to a drain terminal of the second switch SW2. A source terminal of the second switch SW2 is connected to the ground terminal. A second switching signal S2 is applied to a gate terminal of the second switch SW2. The second switching signal S2 has a first voltage level L1 according to a high state and a second voltage level L2 according to a low state.

As the first NMOS transistor MN1 is turned on, the third node n3 is in the ground state. A large voltage is applied to the third node n3 instantaneously by a current applied through the second PMOS transistor MP2. By the instantaneous large voltage, the voltage of the third node n3 becomes higher than a voltage by a current signal outputted from the light receiving device PD. At this point, the second switching signal S2 of the first voltage level L1 is applied to the second switch SW2. The second switch SW2 is turned-on and the raised voltage of the third node n3 is discharged to the ground terminal through the third NMOS transistor MN3.

Through a discharging process, the magnitude of a current applied through the second PMOS transistor MP2 becomes identical to the magnitude of a current signal outputted from the light receiving device PD. At this point, the second switching signal S2 of the second voltage level L2 is applied to the second switch SW2 and the second switch SW2 is turned-off.

An ideal light receiving device PD generates only a current signal proportional to the amount of incident light. However, a current signal is generated even when light is not incident due to the thermal cause and insulation defect of the light receiving device PD. This is called dark current. In order for accurate current signal measurement and amplification, the current offset removal unit 230 is required.

The current offset removal unit 240 includes first to nth current sources CS1 to CSn and first to nth control switches SW01 to SW0n. The current source is a device applying a constant current regardless of an applied voltage. The first to nth current sources CS1 to CSn are connected respectively between source terminals and a power terminal VDD of the first to nth control switches SW01 to SW0n. Drain terminals of the first to nth control switches SW01 to SW0n are connected to the second node n2 and first to nth control signals S01 to S0n are applied to gate terminals, respectively. The first to nth control signals S01 to S0n have a first voltage level L1 according to a high state and a second voltage level L2 according to a low state.

The magnitude of a dark current generated according to the characteristics of a material constituting the light receiving device PD. Accordingly, the first to nth current sources CS1 to CSn activated in accordance with the magnitude of a predetermined dark current are selected. Control signals of the second voltage level L2 are applied to gate terminals of first to nth dark current removal switches SW01 to SW0n connected to the activated first to nth current sources CS1 to CSn.

Control signals of the first voltage level L1 are applied to the gate terminals of the first to nth dark current removal switches SW01 to SW0n connected to the inactivated first to nth current sources CS1 to CSn. The activated firsts to nth current sources CS1 to CSn allow a current having a magnitude identical or similar to the magnitude of a dark current to flow. Accordingly, a current corresponding to a dark current is not applied to the current signal amplification unit 250.

The current signal amplification unit 250 amplifies the magnitude of a current signal generated from the light receiving device PD. The current signal amplification unit 250 includes second and third PMOS transistor MP2 and MP3, first to nth current signal amplification transistors MB1 to MBn, and first to nth amplification switches SWB1 to SWBn. A source terminal of the second PMOS transistor MP2 is connected to the power terminal VDD. A drain terminal and a gate terminal of the second PMOS transistor MP2 are connected to the second node n2.

A source terminal of the third PMOS transistor MP3 is connected to the power terminal VDD and its drain terminal is connected to a fourth node n4. A gate terminal of the third PMOS transistor MP3 is connected to the second node n2. Accordingly, a gate terminal of the third PMOS transistor MP3 is connected to the drain terminal of the second PMOS transistor MP2.

Source terminals of first to nth current signal amplification transistors MB1 to MBn are connected to the power terminal VDD and their gate terminals are connected to the second node n2. Drain terminals of first to nth current signal amplification transistors MB1 to MBn are connected to source terminals of the first to nth amplification switches SWB1 to SWBn, respectively. Drain terminals of the first to nth amplification switches SWB1 to SWBn are connected to the fourth node n4 and first to nth amplification signals SB1 to SBn are applied to gate terminals of the first to nth amplification switches SWB1 to SWBn. The first to nth amplification signals SB1 to SBn have a first voltage level L1 according to a high state and a second voltage level L2 according to a low state.

An output terminal OUT is connected to the fourth node n4. A current signal amplified through the first to nth current signal amplification transistors MB1 to MBn is outputted to the output terminal OUT through the fourth node n4.

Since the gate terminals of the first to nth current signal amplification transistors MB1 to MBn and the second and third PMOS transistors MP2 and MP3 are all connected to the second node n2, an applied gate signal is identical. Accordingly, the magnitude of a current flowing in the first to nth current signal amplification transistors MB1 to MBn and the third PMOS transistors MP3 is identical to the magnitude of a current flowing in the second PMOS transistor MP2. The magnitude of a current flowing in the second PMOS transistor MP2 is identical to the magnitude of a current signal outputted from the light receiving device PD. Therefore, a current having the same magnitude as a current signal outputted from the light receiving device PD is applied to the first to nth current signal amplification transistors MB1 to MBn. According to the number of the activated first to nth current signal amplification transistors MB1 to MBn, the amplification of a current signal is adjusted.

As one example, in order to amplify a current signal 50 times, first to fiftieth amplification signals SB1 to SB50 of the second voltage level L2 are applied to the gate terminals of first to fiftieth amplification switches SWB1 to SWB50 connected to first to fiftieth current signal amplification transistors MB1 to MB50. A current having the same magnitude as a current signal outputted from the light receiving device PD is applied to the fourth node n4 through the first to fiftieth transistors MB1 to MB50. Accordingly, the 50 times amplified current signal is outputted through the output terminal OUT connected to the fourth node n4.

As one example, the cross-sectional areas of the first to nth current signal amplification transistors MB1 to MBn may be different from that of the second PMOS transistor MP2. As one example, when the ratios of the cross-sectional areas of the first to nth current signal amplification transistors MB1 to MBn are increased, the number of transistors in the current signal amplification unit 250 may be reduced.

The current-voltage selection unit 260 converts an amplified current signal into a voltage signal. The current-voltage selection unit 260 includes a third switch SW3 and a resistor R. A drain terminal of the third switch SW3 is connected to the fourth node n4 and its source terminal is connected to the resistor R. A third switching signal S3 is applied to a gate terminal of the third switch SW3. The third switching signal S3 has a first voltage level L1 according to a high state and a second voltage level L2 according to a low state. The resistor R is connected between a source terminal of the third switch SW3 and the ground terminal.

In the case of a current signal out mode, a third switching signal S3 of the second voltage level L2 is applied to the gate terminal of the third switch SW3. The third switch SW3 is turned-off and an amplified current signal is outputted to the output terminal OUT through the fourth node n4.

In the case of a voltage signal out mode, the third switching signal S3 of the second voltage level L1 is applied to the gate terminal of the third switch SW3. The third switch SW3 is turned-off and an amplified current signal is applied to the resistor R through the fourth node n4. The amplified current signal is converted into a first voltage signal by the resistor R. The first signal is outputted again to the output terminal OUT through the fourth node n4.

The multiplier 200 amplifies a current signal outputted from the light receiving device PD. The multiplier 200 removes a dark current generated from the light receiving device PD by the current offset removal unit 240 so as to improve output efficiency. Additionally, the current-voltage selection unit 260 converts an amplified current signal into a first voltage signal. By outputting an amplified current signal or converting an amplified current signal into a first voltage signal and outputting it, selective output is possible.

Figure 3:
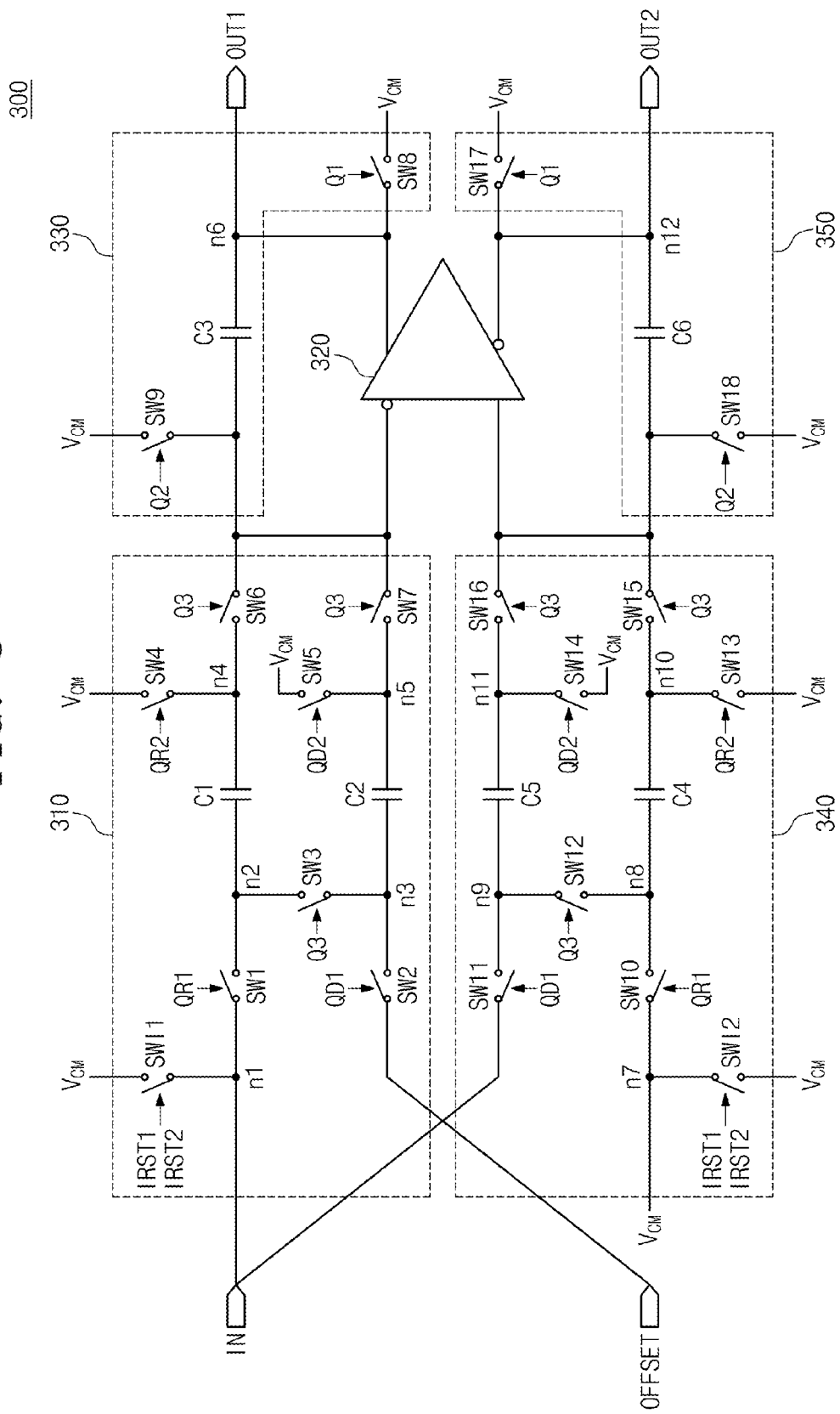
FIG. 3 is a circuit diagram illustrating a multi input amplifier shown in FIG. 1 according to an embodiment of the present invention.

FIG. 3 is a circuit diagram illustrating the multi input amplifier shown in FIG. 1 according to an embodiment of the present invention. Referring to FIG. 3, the multi input amplifier unit 300 is identical to the first to nth multi input amplifiers AMP1 to AMPn shown in FIG. 1. The multi input amplifier 300 includes a first amplifier unit 310, a differential amplifier 320, a first output unit 330, a second amplifier unit 340, and a second output unit 350.

The first amplifier unit 310 includes a first reset switch SWI1, first to seventh switches SW1 to SW7, and first and second capacitors C1 and C2. One end of the first reset switch SWI1 is connected to a first node n1 and the other end is connected to a common terminal VCM. An input terminal IN is connected to a first node n1 and a current signal or a first voltage signal is applied to the node n1.

The first switch SW1 may be connected to between the first and second nodes n1 and n2. One end of the second switch SW2 is connected to an offset terminal OFFSET and the other end is connected to a third node n3. The third switch SW3 may be connected to between the second and third nodes n2 and n3. The first capacitor C1 may be connected to between the second and fourth nodes n2 and n4. The second capacitor C2 may be connected to between the third and fifth nodes n3 and n5.

One end of the fourth switch SW4 is connected to the fourth node n4 and the other end is connected to the common terminal VCM. One end of the fifth switch SW5 is connected to the common terminal VCM and the other end is connected to the fifth node n5. One end of the sixth switch SW6 is connected to the fourth node n4 and the other end is connected to the fifth node n5. The other ends of the sixth and seventh switches SW6 and SW7 are connected to the differential amplifier 320.

The first output 330 includes a third capacitor C3 and eighth and ninth switches SW8 and SW9. One end of the eighth switch SW8 is connected to a sixth node n6 and other end is connected to the common terminal VCM. One end of the ninth switch SW9 is connected to the other end of the sixth switch SW6 and the other end of the ninth switch SW9 is connected to the common terminal VCM. The third capacitor C3 is connected to the sixth node n6. One end of the ninth switch SW9 is connected to the sixth node n6 and other end is connected to the common terminal VCM. A first output terminal OUT1 is connected to the sixth node n6.

The second amplifier unit 340 includes a second reset switch SWI2, tenth to 16th switches SW10 to SW16, and fourth and fifth capacitors C4 and C5. One end of the second reset switch SWI2 is connected to the seventh node n7 and the other end is connected to the common terminal VCM. The common terminal VCM is connected to the seventh node n7. The tenth switch SW10 is connected to between the seventh and eighth n7 and n8. One end of the 11th switch SW11 is connected to the input terminal IN and the other end is connected to the ninth node n9. The 12 th switch SW12 is connected between the eighth and ninth nodes n8 and n9.

The fourth capacitor C4 is connected between the eighth and tenth nodes n8 and n10 and the fifth capacitor C5 is connected between the ninth and 11th nodes n9 and n11. One end of the 13th switch SW13 is connected to the tenth node n10 and the other end is connected to the common terminal VCM. One end of the 14th switch SW14 is connected to the common terminal VCM and the other end is connected to the 11th node n11. One end of the 15th switch SW15 is connected to the tenth node n10 and one end of the 16th switch SW16 is connected to the 11th node n11. The other ends of the 15th and 16th switches are connected to the differential amplifier 320.

The second amplifier unit 350 includes a sixth capacitor C6 and 17th and 18th switches SW17 and SW18. One end of the 17th switch SW17 is connected to the 12th node and the other end is connected to the common terminal VCM. One end of the 18th switch SW18 is connected to the other end of the 15th switch SW15. The other end of the 18th switch SW18 is connected to the common terminal VCM. The sixth capacitor C6 is connected to the 12th node n12.

According to the present invention, a common mode voltage is applied through the command terminal VCM. According to the present invention, the first to 18th switches SW1 to SW18 and the first and second reset switches SWI1 and SWI2 may be transistors.

Figure 4:
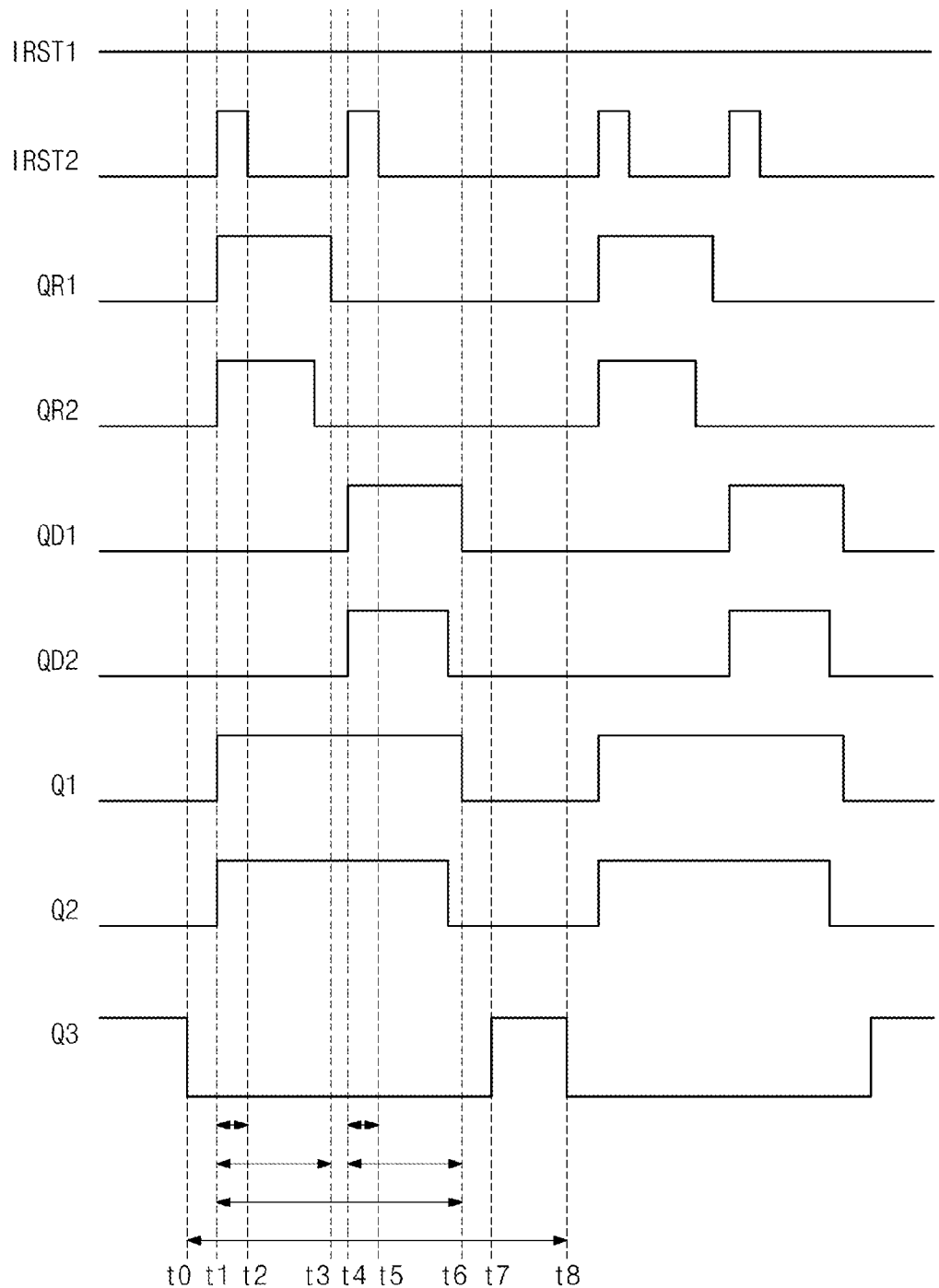
FIG. 4 is a signal diagram illustrating clock signals inputted to a multi input amplifier shown in FIG. 3 according to an embodiment of the present invention.

FIG. 4 is a signal diagram illustrating clock signals inputted to the multi input amplifier shown in FIG. 3 according to an embodiment of the present invention. Referring to FIGS. 3 and 4, the first to 18th switches SW1 to SW18 and the first and second reset switches SWI1 and SWI2 in the multi input amplifier 300 of FIG. 3 are turned-on or turned-off by a clock signal of FIG. 4. The multi input amplifier 300 has a structure that is symmetric on the basis of a first output terminal OUT1 and a second output terminal OUT2. Accordingly, the same clock signal is applied to switches at the symmetric positions. The drive of the multi input amplifier 300 may be largely divided into a sampling mode and an amplification mode and may then be described.

In more detail, referring to FIGS. 3 and 4, first and second reset signals IRST1 and IRST2 are applied to the gate terminals of the first and second reset terminals SWI1 and SWI2. A first initial value sampling signal QR1 is applied to the gate terminals of the first and tenth switches SW1 and SW10 and a second initial sampling signal QR2 is applied to the gate terminals of the fourth and 13th switches SW4 and SW13. A first data sampling signal QD1 is applied to the gate terminals of the second and 11th switches SW2 and SW11 and a second data sampling signal QD2 is applied to the gate terminals of the fifth and 14th switches SW5 and SW14. A first sampling mode signal Q1 is applied to the gate terminals of the ninth and 18th switches SW9 and SW18 and a second sampling mode signal Q2 is applied to the gate terminals of the eighth and 17th switches SW8 and SW17.

An amplification mode signal Q3 is applied to the gate terminals of the third, sixth, seventh, 12th, 15th, and 16th switches SW3, SW6, SW7, SW12, SW15, and SW16. The first and second reset signals IRST1 and IRST2, the first and second initial value sampling signals QR1 and QR2, the first and second data sampling signals QD1 and QD2, the first and second sampling mode signals Q1 and Q2, and the amplification mode signal Q3 have a first voltage level L1 according to a high level and a second voltage level L2 according to a low state.

A current signal or a first voltage signal amplified from the multiplier 200 (see FIG. 2) is applied to the input terminal IN. Once the first voltage signal is applied to the input terminal IN, a first reset signal IRST1 is applied to the gate terminals of the first and second reset switches SWI1 and SWI2. The first reset signal IRST1 has the second voltage level L2 at all times. Once an amplified current signal is applied to the input terminal IN, the second reset signal IRST2 is applied to the gate terminals of the first and second reset switches SWI1 and SWI2.

Once an amplified current signal is applied to the input terminal IN, at the initial time t0, the amplification mode signal Q3 of the second voltage level L2 is applied to the gate terminals of the third, sixth, and seventh switches SW3, SW6, and SW7. Accordingly, the third, sixth, and seventh switches SW3, SW6, and SW7 are turned-off.

At the first time t1, the second reset signal IRST2 of the first voltage level L1 is applied to the gate terminal of the first reset switch SWI1. The first initial value sampling signal QR1 of the first voltage level L1 is applied to the gate terminal of the first switch SW1 and the second initial value sampling signal QR2 is applied to the gate terminal of the fourth switch SW4. Accordingly, the first reset switch SWI1 and the first and fourth switches SW1 and SW4 are turned-on at the same time. As the first reset switch SWI1 is turned-on, a common mode voltage may be applied to the first node n1. An amplified current signal applied through the input terminal IN may have an initial voltage as a common mode voltage.

At the second time t2, the second reset signal IRST2 of the second voltage level L2 is applied to the gate terminal of the first reset switch SWI1. As the first switch SW1 is turned-on, the voltage of the second node n2 rises in proportion to an input of a current signal amplified based on a common mode voltage. When the voltage of the second node n2 rises, the amount of electric charges charged to the first capacitor C1 is increased. As the fourth switch SW4 is turned-on, a common mode voltage is applied to the fourth node n4.

At the third time t3, the first initial value sampling signal QR1 of the second voltage level L2 is applied to the gate terminal of the first switch SW1. Accordingly, the first switch SW1 is turned-off and charging the first capacitor C1 stops.

The second initial value sampling signal QR2 applied to the fourth switch SW4 shifts into the second voltage level L2 before the third time t3. When the first switch SW1 is turned-off, electric charges remaining in a channel area of the first switch SW1 may affect the first capacitor C1. An amplified current signal and a first voltage signal applied to the input terminal IN may vary according to the magnitude of a current signal generated by the light receiving device PD of the multiplier 200 and the amplification degree of the current signal amplifier unit 250. Since a voltage applied to the first switch SW1 is not constant, this affects the first capacitor C1 differently.

Since a common mode voltage is applied to the fourth node n4 at all times, this affects the first capacitor C1 constantly. Accordingly, when the fourth switch SW4 is turned-off first, the fourth node n4 becomes in a floating state. When the first switch SW1 is turned-off after a predetermined time, due to electric charges remaining in a channel area of the first switch SW1, the voltage of the second node n2 rises and also the voltage of the fourth node n4 rises at the same time. Since the voltages of the second and fourth nodes n2 and n4 rise at the same time, the amount of electric charges charged in the first capacitor C1 does not change.

At the first time t1, the first and second sampling mode signals Q1 and Q2 of the first voltage level L1 are generated. The ninth switch SW9 is turned-on by the first sampling mode signal Q1 of the first voltage level L1 and the eighth switch SW8 is turned-on by the second sampling mode signal Q2. Since a common mode voltage is applied to the both ends of the third capacitor C3, the third capacitor C3 is not charged. According to the present invention, a sampling mode starts at the first time t1.

At the fourth time t4, the first and second sampling signals QD1 and QD2 of the first voltage level L1 are generated. The second switch SW2 is turned-on by the first data sampling signal QD1 of the first voltage level L1 and the fifth switch SW5 is turned-on by the second data sampling signal QD2. An offset voltage is applied to the third node n3 through the second switch SW2. A common mode voltage is applied through the fifth switch SW5. Accordingly, the amount of electric charges proportional to a difference between an offset voltage and a common mode voltage is charged to the second capacitor C2 disposed between the third node n3 and the fifth node n5.

At the sixth time t6, the first data sampling signal QD1 shifts into the second voltage level L2. The second data sampling signal QD2 shifts into the second voltage level L2 before the sixth time t6. Accordingly, after the fifth switch SW5 is turned-off, the second switch SW2 is turned-off. This is the same reason that the after the fourth switch SW4 is turned-off, the first switch SW1 is turned-off.

At the sixth time t6, the first sampling mode signal Q1 shifts into the second voltage level L2. The second sampling mode signal Q2 shifts into the second voltage level L2 before the sixth time t6. Accordingly, after the eighth switch SW8 is turned-off, the ninth switch SW9 is turned-off. This is the same reason that the after the fourth switch SW4 is turned-off, the first switch SW1 is turned-off. According, at the sixth time t6, the sampling mode of a signal is terminated.

At the seventh time t7, the amplification mode signal Q3 of the first voltage level L1 is generated. Accordingly, the third, sixth, and seventh switches SW3, SW6, and SW7 are turned-on by the amplification mode signal Q3 of the first voltage level L1. The first sampling voltage generated by the amount of electric charges stored in the first capacitor C1 is applied to the differential amplifier 320 and the third capacitor C3 through the sixth switch SW6. The second sampling voltage generated by the amount of electric charges stored in the second capacitor C2 is applied to the differential amplifier 320 and the third capacitor C3 through the seventh switch SW7. The first and second sampling voltages are outputted to the sixth node n6 through the differential amplifier 320. According to the present invention, a time of the amplification mode signal Q3 of the first voltage level L1 is defined as an amplification mode.

The gain of a first output voltage outputted to the first output terminal OUT1 is determined by a ratio of the capacity of the third capacitor C3 to the sum of the capacities of the first and second capacitors C1 and C2. In more detail, if the sum of the capacities of the first and second capacitors C1 and C2 is identical to the capacity of the third capacitor D3, the first and second sampling voltages are outputted as a first output voltage to the first output terminal OUT1. If the capacity of the first capacitor C1 is two times the capacity of the third capacitor C3, twice the first and second sampling voltages are outputted as a first output voltage to the first output terminal OUT1.

At the eighth time t8, the amplification mode signal Q3 shifts into the second voltage level L2. The third, sixth, and seventh switches SW3, SW6, and SW7 are turned-off and the amplification mode is terminated.

The second amplifier unit 340 and the second output unit 350 have symmetric structures to the first input unit 320 and the first output unit 330, respectively. At the initial time t0, the amplification mode signal Q3 of the second signal level L2 is applied to the 12th, 16th, and 17th switches SW12, SW16, and SW17. Accordingly, the 12th, 16th, and 17th switches SW12, SW16, and SW17 are turned-off.

At the first time t1, the second reset signal IRST2 of the first voltage level L1 is applied to the second reset switch SWI2. A common mode voltage is applied to the seventh node n7 through the second reset switch SWI2. Since a common mode voltage is applied to the seventh node n7, it is unnecessary to apply a common mode voltage through the second reset switch SWI2. However, in order for a symmetric structure of the multi input amplifier 300, the second reset switch SWI2 exists.

At the second time t2, the second reset signal IRST2 of the second voltage level L2 is applied to the second reset switch SWI2. Accordingly, the second reset switch SWI2 is turned-off.

At the first time t1, the first and second initial sampling signals QR1 and QR2 of the first voltage level L1 are generated. The tenth switch SW10 is turned-on by the first initial sampling signal QR1 of the first voltage level L1. The 13th switch SW13 is turned-on by the second initial sampling signal QR2 of the first voltage level L1. A common mode voltage is applied to the eighth node n8 through the tenth switch SW10. A common mode voltage is applied to the tenth node n10 through the 13th switch SW10. The fourth capacitor C4 is connected to between the eighth node n8 and the tenth node n10. Since a common mode voltage is applied to the both ends of the fourth capacitor C4, electric charges are not charged to the fourth capacitor C4.

At the third time t3, the first initial value sampling signal QR1 of the second voltage level L2 is applied to the tenth switch SW10. The second initial value sampling signal QR2 of the second voltage level L2 is applied to the 13th switch SW13 before the third time t3. Accordingly, after the 13th switch SW13 is turned-off, the tenth switch SW10 is turned-off. This is not to affect the amount of electric charges charged to the fourth capacitor C4.

Additionally, at the first time t1, the first and second sampling mode signals Q1 and Q2 of the first voltage level L1 are generated. The second sampling mode signal Q2 of the first voltage level L1 is applied to the gate terminal of the 17th switch SW17. The 17th and 18th switches SW17 and SW18 are turned-on and a common mode voltage is applied. Since the voltages at both ends are the same, electric charges are not charged to the sixth capacitor C6 connected between the 17th and 18th switches SW17 and SW18. At the first time t1, a sampling mode starts.

At the fourth time t4, the second reset signal IRST2 of the first voltage level L1 is applied to the first reset switch SWI1. Accordingly, the first reset switch SWI1 is turned-off. The first data sampling signal QD1 of the first voltage level L1 is applied to the 11th switch SW11. The second data sampling signal QD2 of the first voltage level L1 is applied to the 14th switch SW14. The 11th and 14th switches SW11 and SW14 are turned-on. Once the first reset switch SWI1 is turned-on, an amplified current signal applied through the input terminal IN may have an initial voltage as a common mode voltage.

At the fifth time t5, the second reset signal IRST2 of the second voltage level L2 is applied to the first reset switch SWI1. The first reset switch SWI1 is turned-off.

An amplified current signal is applied to the ninth node n9 through the 11th switch SW11 and the voltage of the ninth node n9 is increased more than a common mode voltage. A common mode voltage is applied to the 11th node n11 through the 14th switch SW14. The fifth capacitor C5 is connected between the ninth node n9 and the 11th node n11. Accordingly, the amount of electric charges of the fifth capacitor C5 is charged by the increased voltage of the ninth node n9.

At the sixth time t6, the first data sampling signal QD1 shifts into the second voltage level L2. The second data sampling signal QD2 shifts into the second voltage level L2 before the sixth time t6. When the 14th switch SW14 is turned-off, the 11th switch SW11 is turned-off sequentially. This is not to affect the amount of electric charges charged to the fifth capacitor C5.

At the sixth time t6, the first sampling mode signal Q1 shifts into the second voltage level L2. The second sampling mode signal Q2 shifts into the second voltage level L2 before the sixth time t6. When the 17th switch SW17 is turned-off, the 18th switch SW11 is turned-off sequentially. This is not to affect the amount of electric charges charged to the sixth capacitor C6. At the sixth time t6, the sampling mode is terminated.

At the seventh time t7, the amplification mode signal Q3 of the first voltage level L1 is generated. The amplification mode signal Q3 of the first voltage level L1 is applied to the 12th, 15th, and 16th switches SW12, SW15, and SW16. Accordingly, the 12th, 15th, and 16th switches SW12, SW15, and SW16 are turned-on. At the seventh time t7, an amplification mode starts.

The fifth sampling voltage generated by the amount of electric charges charged to the fifth capacitor C5 is applied to the differential amplifier 320 and the sixth capacitor C6 through the 16th switch SW16. The fifth sampling voltage is outputted to the 12th node n12 through the differential amplifier 320. The gain of a second output voltage outputted through the second output terminal OUT2 is determined by a ratio of the capacity of the sixth capacitor C6 to the sum of the capacities of the fourth and fifth capacitors C4 and C5.

At the eighth time t8, the amplification mode signal Q3 shifts into the second voltage level L2. The 12th, 15th, and 16th switches SW12, SW15, and SW16 are turned-off and the amplification mode is terminated.

When an amplified current signal is applied to the input terminal IN of the multi input amplifier 300, a charging time of the first and fifth capacitors C1 and C5 charged by the amplified current signal may be adjusted. Through a charging time adjustment, the magnitudes of the first and fifth sampling voltages are changed. Accordingly, an output gain may be adjusted. By adjusting an applying time of the first initial value sampling signal QR1 and the first data sampling signal QD1, a charging time adjustment is possible.

According to an embodiment of the present invention, a current-voltage conversion amplifier circuit may select a voltage and current mode in order for amplification. In the case of a current mode, by adjusting a sampling time of a multi input amplifier, a desired output voltage may be obtained.

In describing each drawing, like reference numerals refer to like elements. In the accompanying drawings, the dimensions of structures are exaggerated for clarity of illustration. It will be understood that the terms "first" and "second" are used herein to describe various components but these components should not be limited by these terms. These terms are used only to distinguish one component from other components. For example, a first component may be referred to as a second component and vice versa without departing from the scope of the present invention. The terms of a singular form may include plural forms unless they have a clearly different meaning in the context.

As mentioned above, embodiments are disclosed in the drawings and the specification. Although specific terms are used herein, this is just to describe the present invention and does not limit the meaning or the scope of the present invention listed in claims. Therefore, it is apparent to those skilled in the art that various embodiments and equivalent other embodiments are possible. Hence, the real protective scope of the present invention shall be determined by the technical scope of the accompanying claims.

What is claimed is:

1. A multiplier comprising:
a bias terminal applying a bias current to a first node;
a start-up unit connected between the first node and a power terminal and applying an additional current to the first node;
a reference voltage generation unit connected between a second node and a ground terminal and maintaining a voltage constantly between the second node and the ground terminal;
a discharging unit connected between a third node and the ground terminal and discharging a voltage of the third node;

a current offset removal unit connected between the power terminal and the second node and removing a dark current outputted even when light is not incident to a light receiving device;

a current signal amplifier unit connected between the power terminal and an output terminal and amplifying a current signal outputted from the light receiving device and outputting the amplified current signal; and a current-voltage selection unit connected to a fourth node and converting the amplified current signal into a first voltage signal according to a conversion signal, wherein the light receiving device is connected to the third node.

2. The multiplier of claim 1, wherein the start-up unit comprises a first switch connected to the first node and a first start-up transistor diode-connected between the first switch and the power terminal, wherein the first switch applies the additional current applied through the first start-up transistor to the first node according to a first switching signal applied to a gate terminal.

3. The multiplier of claim 1, wherein the reference voltage generation unit comprises a first reference voltage generation transistor connected between the second and third nodes and a second reference voltage generation transistor connected between the first node and the ground terminal, wherein the first reference voltage transistor is turned-on by the first node voltage applied to the gate terminal and applies to the third node a current signal having the same magnitude as the current signal outputted from the light receiving device.

4. The multiplier of claim 3, wherein the second reference voltage generation transistor is turned-on by the third node voltage applied to the gate terminal and maintains voltages of the first and third nodes constantly by discharging a voltage of the first node.

5. The multiplier of claim 1, wherein the discharging unit comprises a discharge transistor diode-connected to the third node and a discharging switch connected between the discharging transistor and the ground terminal, wherein the discharging switch applies the third node voltage applied to the discharging transistor to the ground terminal according to a discharging signal applied to a gate terminal.

6. The multiplier of claim 1, wherein the current offset removal unit comprises a plurality of dark current removal switches connected to the first node and a plurality of current sources connected between the plurality of dark current removal switches and the power terminal, wherein at least one dark current removal switch connected to at least one current source activated proportional to a magnitude of the dark current outputted from the light receiving device is turned-on.

7. The multiplier of claim 6, wherein a current having a magnitude identical or similar to that of the dark current flows in the at least one activated current source.

8. The multiplier of claim 1, wherein the current signal amplifier unit comprises:

a first current mirror transistor connected between the power terminal and the second node;

a second current mirror transistor having a gate terminal connected to a drain terminal of the first current mirror transistor;

a plurality of amplification switches connected between the fourth node and the output terminal; and a plurality of current signal amplification transistors connected between the plurality of amplification switches and the power terminal and having gate terminals connected to a gate terminal of the first current mirror transistor.

9. The multiplier of claim 8, wherein a gate voltage having the same magnitude as the first current mirror transistor is applied to each of the second current mirror transistor and the plurality of current signal amplification transistors;

a magnitude of the current signal amplified is determined by a ratio of a size with respect to the first current mirror transistor; and at least one amplification switch connected at least one activated current signal amplification transistor is turned-on.

10. The multiplier of claim 1, wherein the signal conversion unit comprises a conversion switch connected to the fourth node and a resistor connected between the conversion switch and the ground terminal;

when turned-off by the conversion signal applied to a gate terminal, the conversion switch outputs the amplified current signal an output terminal; and when turned-on by the conversion signal, the conversion switch converts the amplified current signal into the first voltage signal by the resistor and outputs the converted first voltage signal.

* * * * *